(12) United States Patent
Nakagawa

(10) Patent No.: US 7,268,389 B2
(45) Date of Patent: Sep. 11, 2007

(54) NONVOLATILE SEMICONDUCTOR MEMORY

(75) Inventor: Kenichiro Nakagawa, Kanagawa (JP)

(73) Assignee: NEC Electronics Corp., Kawasaki (JP)

( * ) Notice: Subject to any disclaimer, the term of this patent is extended or adjusted under 35 U.S.C. 154(b) by 0 days.

(21) Appl. No.: 11/076,064

(22) Filed: Mar. 10, 2005

(65) Prior Publication Data
US 2005/0199943 A1    Sep. 15, 2005

(30) Foreign Application Priority Data
Mar. 11, 2004    (JP)    ............................. 2004-069822

(51) Int. Cl.
*H01L 29/792*    (2006.01)
(52) U.S. Cl. .................. 257/324; 257/314; 257/315; 257/390; 257/E27.102; 257/E29.309; 257/E29.129
(58) Field of Classification Search ............... 257/324
See application file for complete search history.

(56) References Cited

U.S. PATENT DOCUMENTS

| | | | |
|---|---|---|---|
| 5,254,867 A * | 10/1993 | Fukuda et al. ............. | 257/411 |
| 5,585,293 A * | 12/1996 | Sharma et al. ............. | 438/261 |
| 5,915,176 A * | 6/1999 | Lim ........................... | 438/257 |
| 6,281,545 B1 * | 8/2001 | Liang et al. ................ | 257/315 |
| 6,323,516 B1 * | 11/2001 | Wang et al. ................ | 257/317 |
| 6,335,554 B1 * | 1/2002 | Yoshikawa .................. | 257/316 |
| 6,388,293 B1 * | 5/2002 | Ogura et al. ................ | 257/365 |
| 6,531,350 B2 * | 3/2003 | Satoh et al. ................ | 438/197 |
| 2003/0067030 A1 * | 4/2003 | Torii ........................... | 257/315 |

FOREIGN PATENT DOCUMENTS

JP    2001-156188    6/2001

\* cited by examiner

*Primary Examiner*—Minhloan Tran
*Assistant Examiner*—Eduardo A. Rodela
(74) *Attorney, Agent, or Firm*—McGinn IP Law Group PLLC

(57) ABSTRACT

A nonvolatile semiconductor memory device includes diffusion layers formed in a semiconductor substrate, a gate insulating film formed on at least a portion of a channel region between the diffusion layers in the semiconductor substrate, and a control gate formed on the gate insulating film. The nonvolatile semiconductor memory device also includes electric charge storage insulating films formed on side surfaces of the control gate, memory gates formed on side surfaces of the sidewall insulating films to be higher than the sidewall insulating film, and a silicide film formed to connect the memory gates and the control electrode.

9 Claims, 16 Drawing Sheets

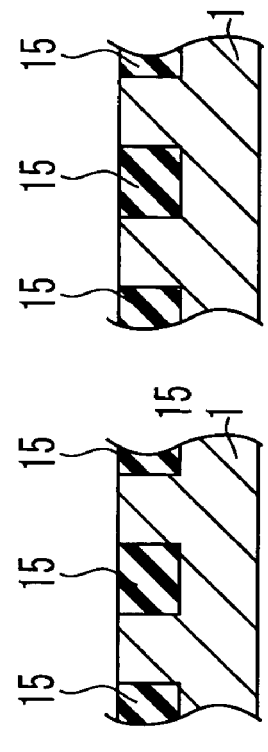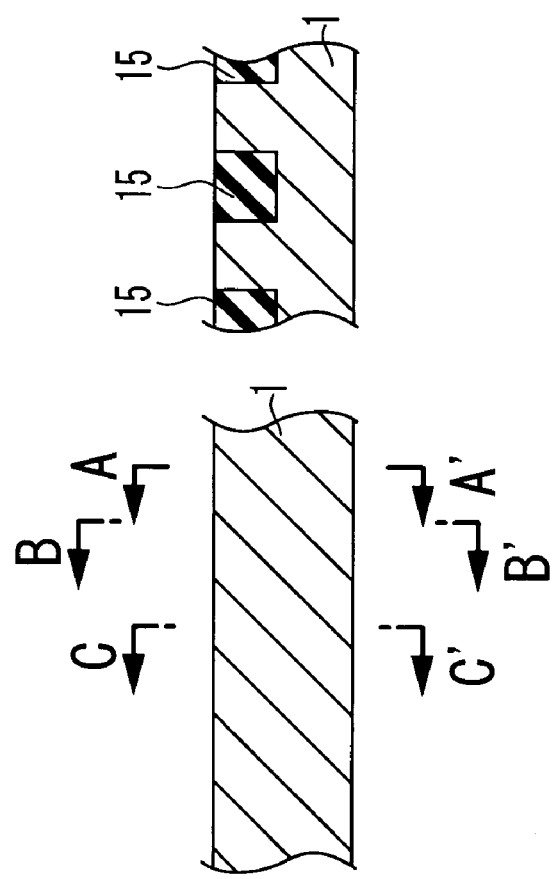

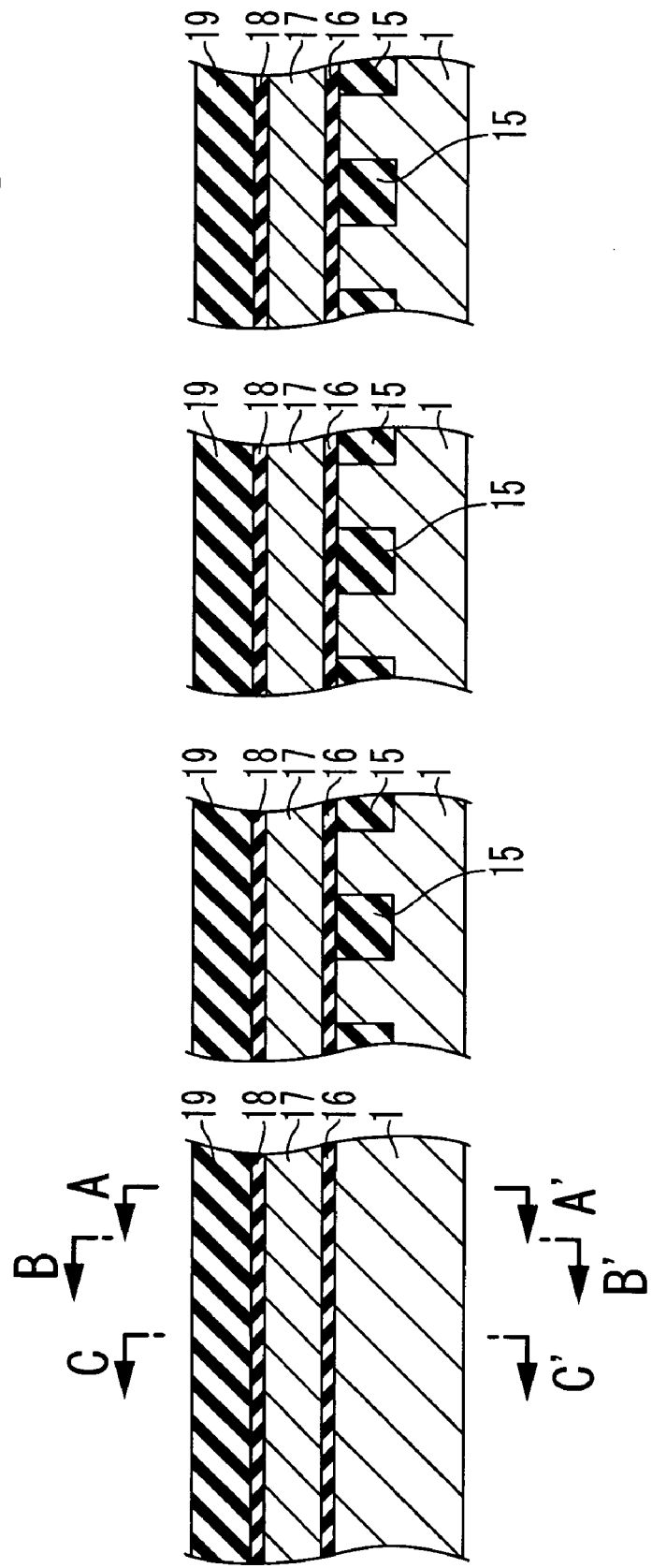

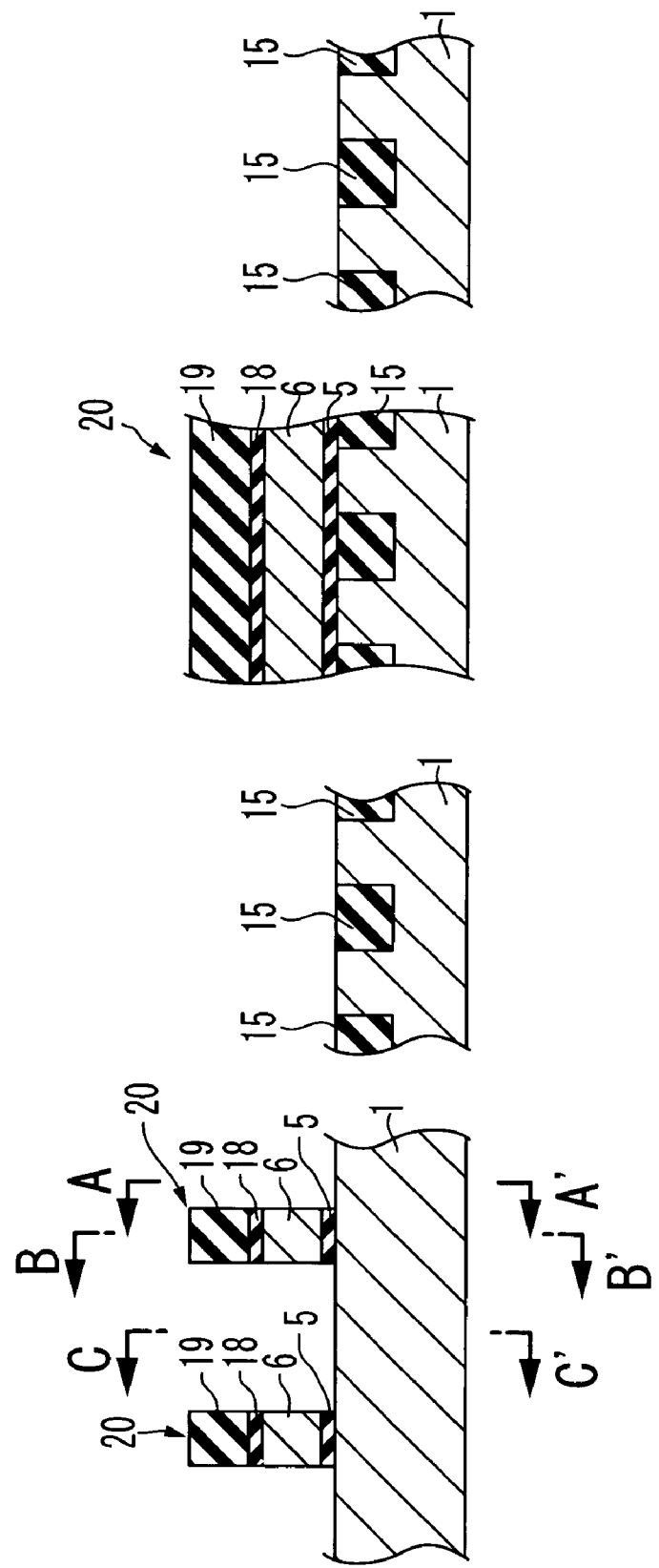

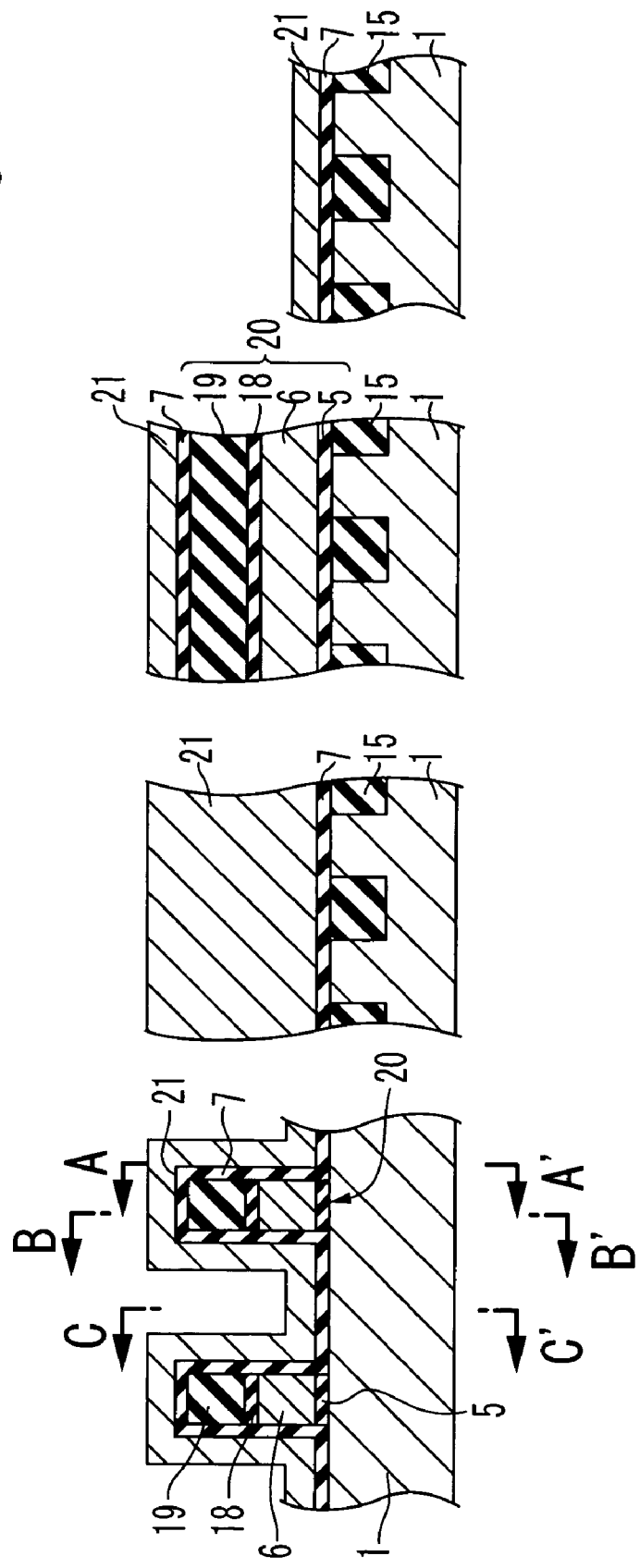

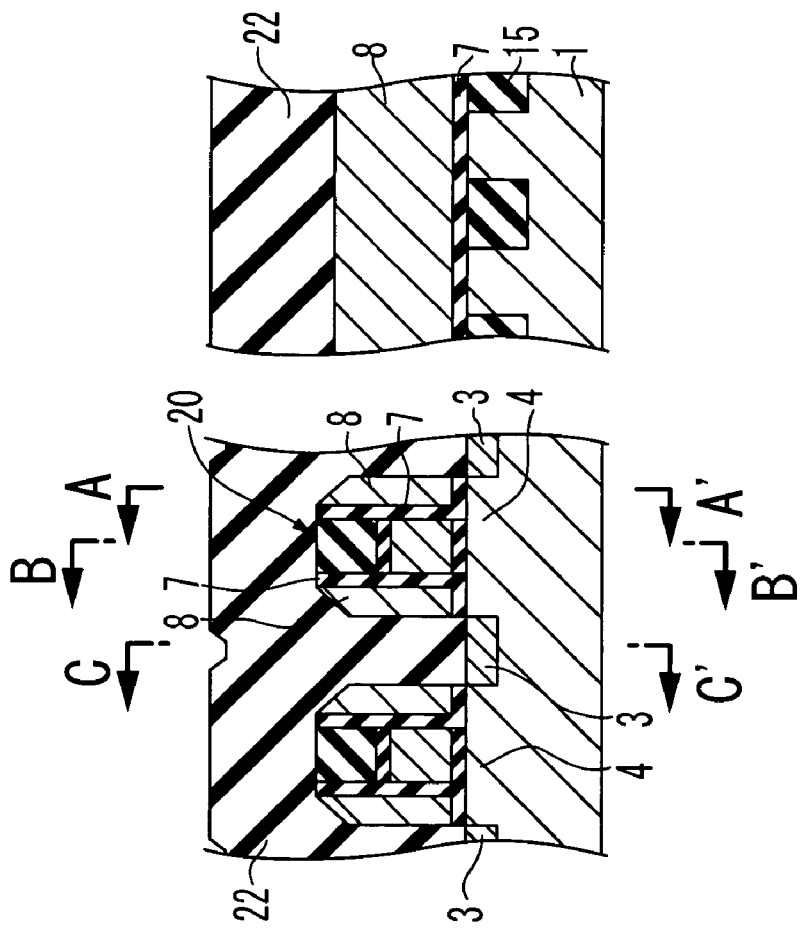
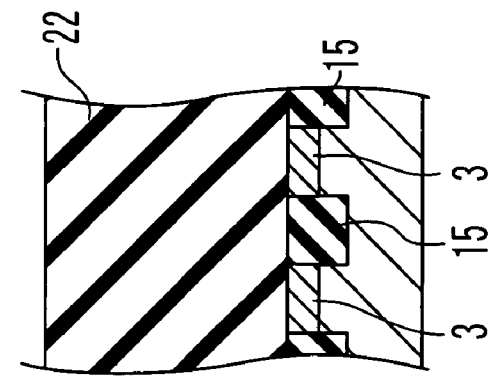

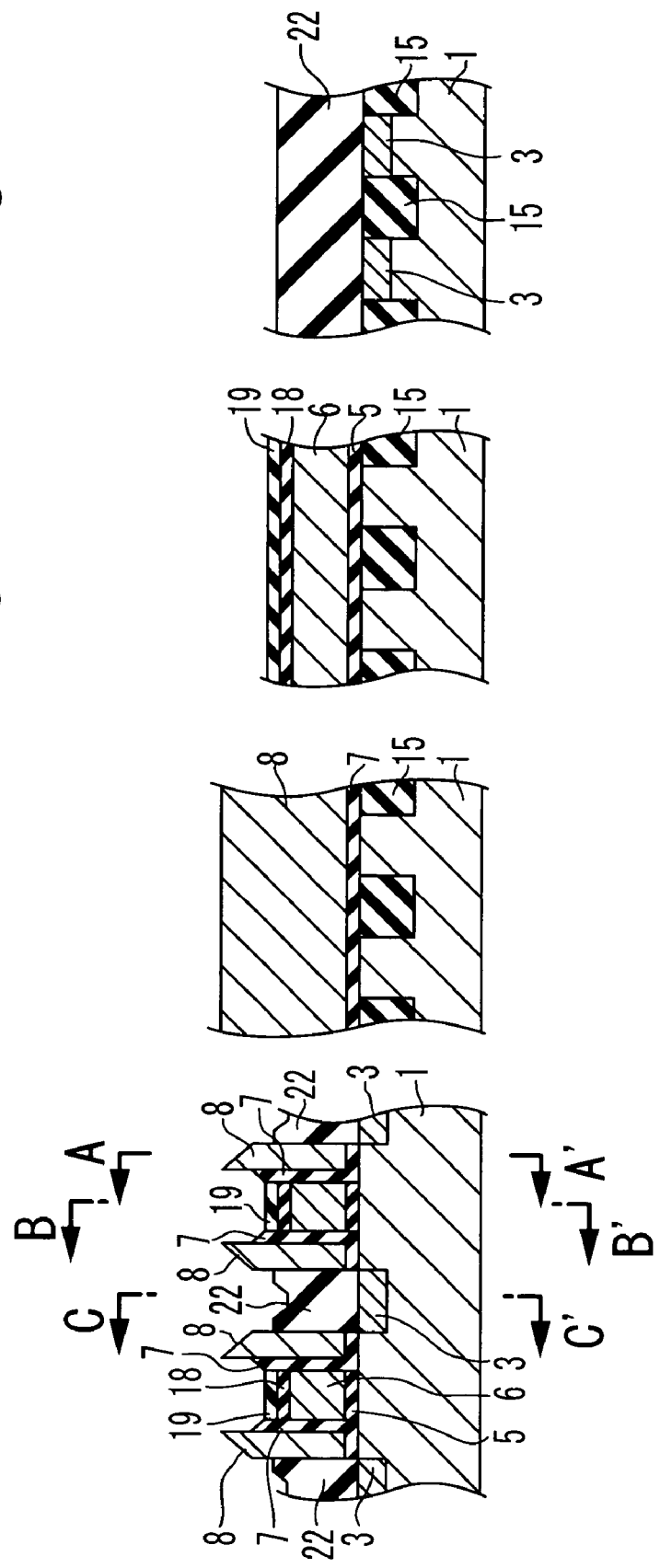

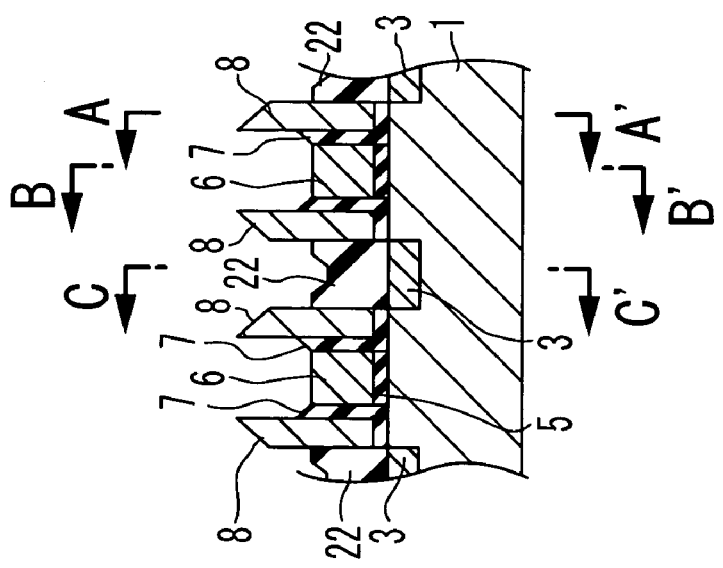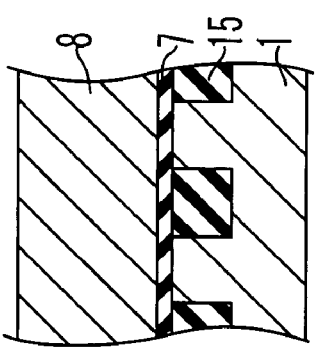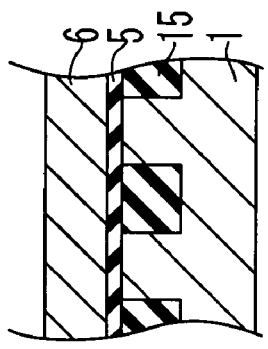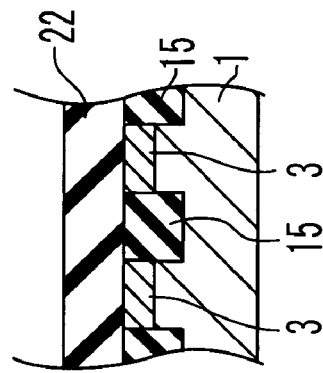

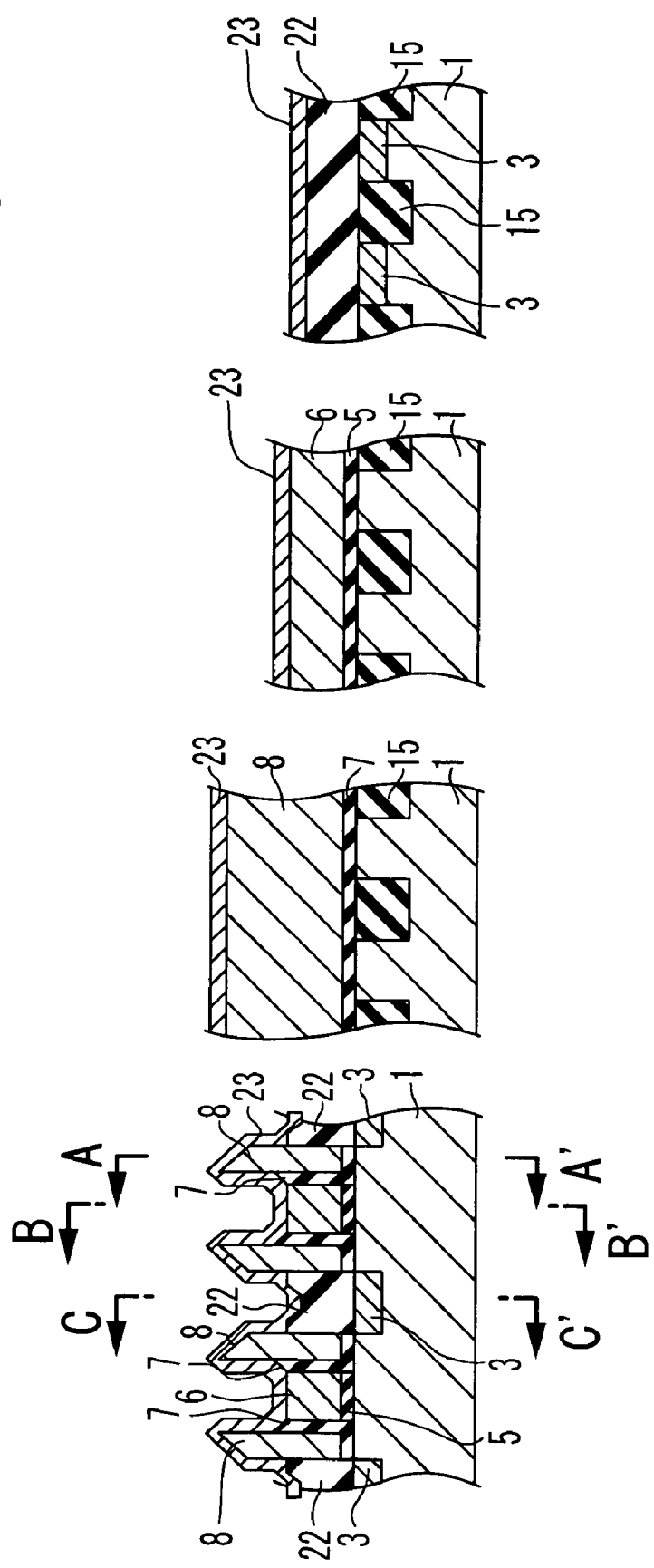

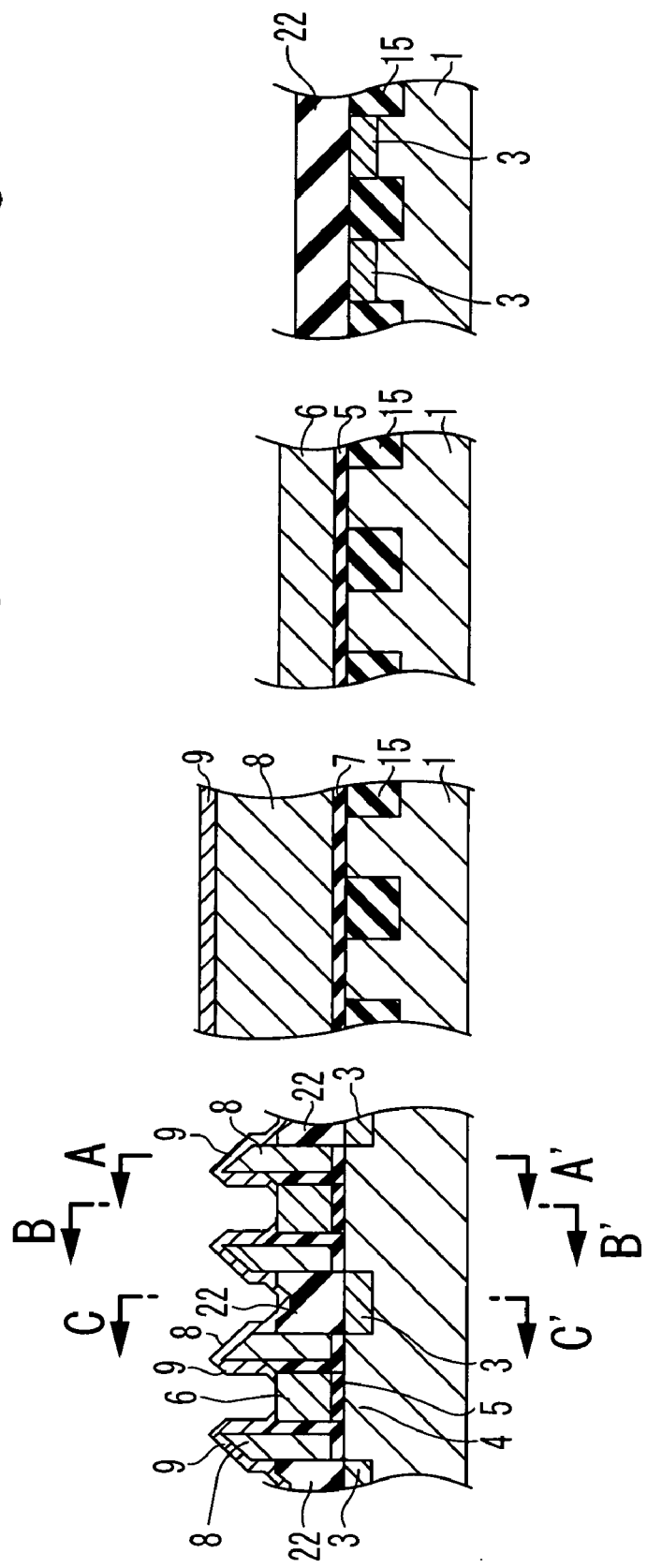

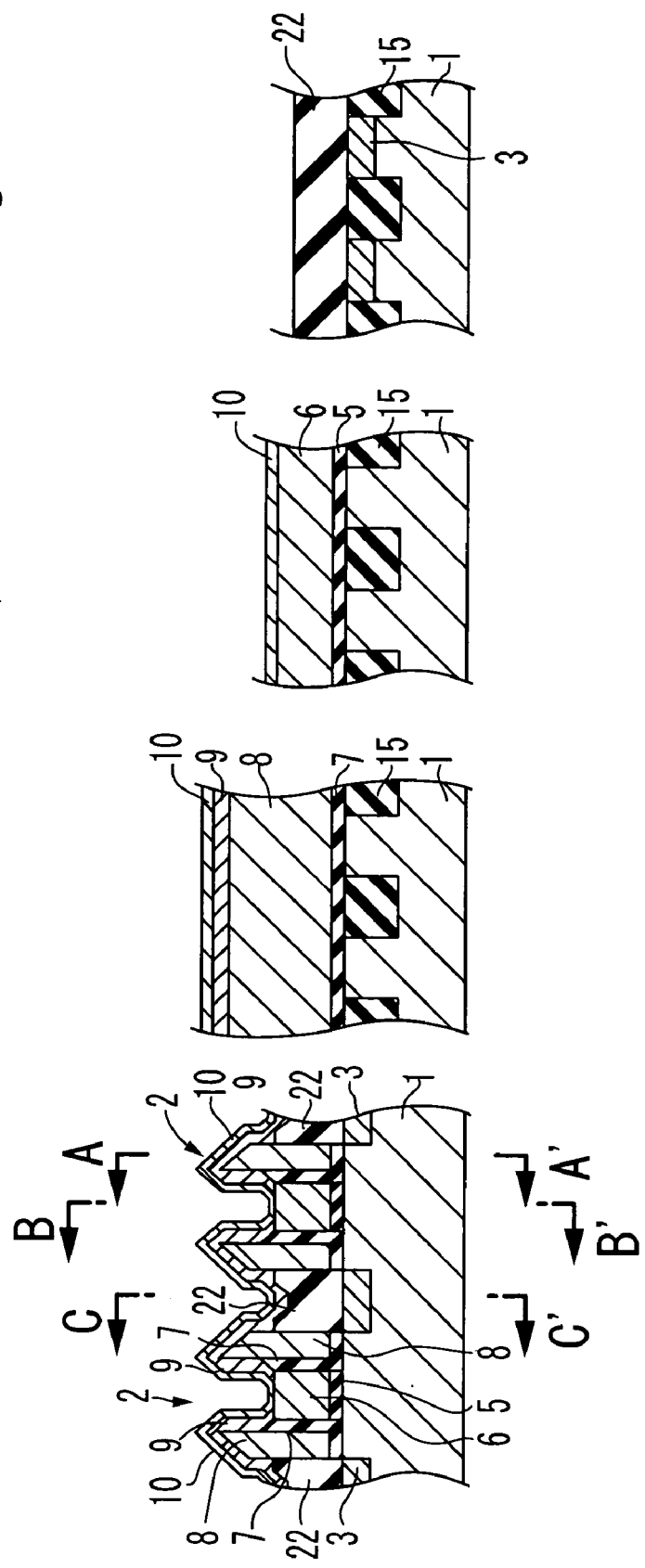

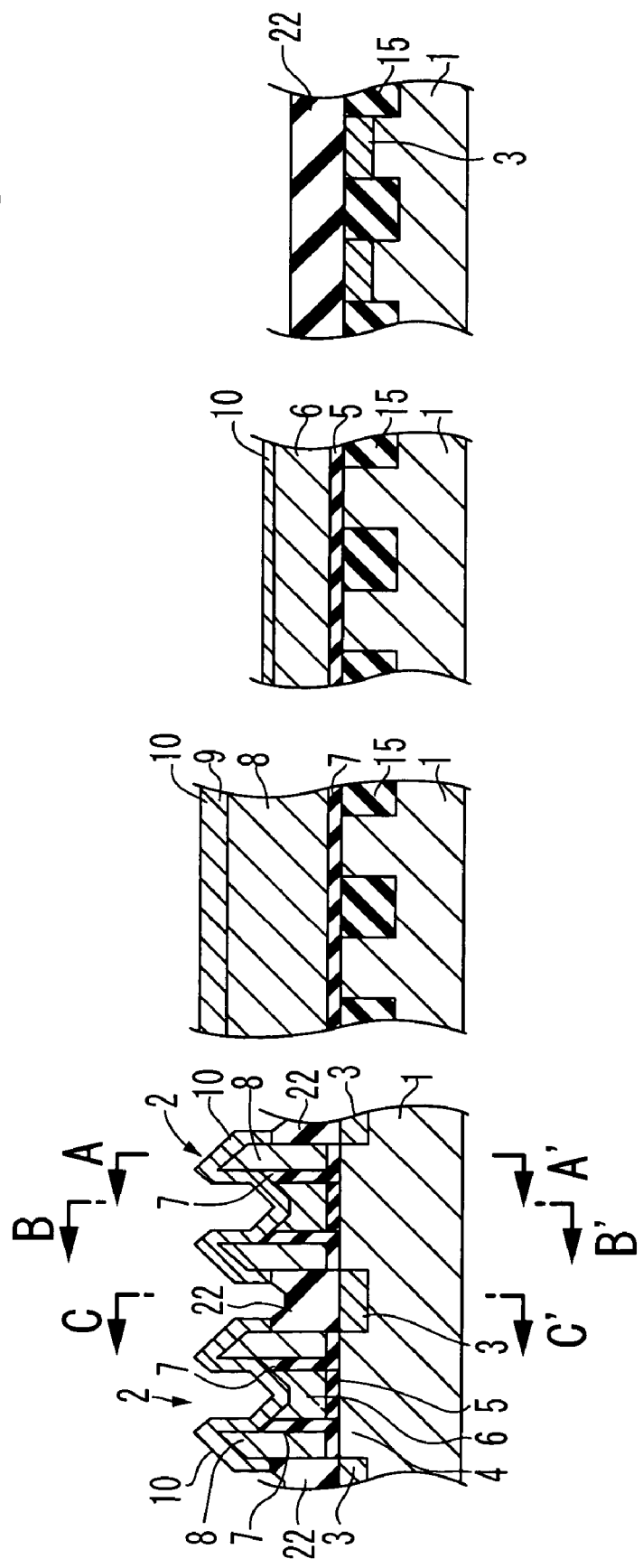

NONVOLATILE SEMICONDUCTOR MEMORY

BACKGROUND OF THE INVENTION

1. Field of the Invention

The present invention relates to a nonvolatile semiconductor memory in which data of two bits or more can be stored per one memory cell, and relates to a manufacturing method of the same.

2. Description of the Related Art

A nonvolatile semiconductor memory in which data of two bits can be stored per one memory cell has been developed in order to achieve high integration of the nonvolatile semiconductor memory, reported in "Embedded Twin MONOS Flash Memories with 4 ns and 15 ns Fast Access Times" by Tomoko Ogura et al., (2003 Symposium on VLSI Circuits, Digest of Technical Papers, pp. 207-210). FIG. 1 is a cross sectional view of such a conventional nonvolatile semiconductor memory. As shown in FIG. 1, the conventional nonvolatile semiconductor memory contains a memory cell 102 formed on the surface of a silicon substrate 101.

In the memory cell 102, source/drain regions 106 are formed in the surface of the silicon substrate 101, a gate insulating film 103 is formed on the region on the silicon substrate 101 between the source drain regions 106. A control gate 104 as a word line is formed on the gate insulating film 103. A silicide layer 105 is provided on the control gate 104. Moreover, memory gates 108 are provided on both sides of the control gate 104. Here, ONO films (Oxide Nitride Oxide films) 107 are respectively formed between the control gate 104 and each of the memory gates 108, and between each of the memory gates 108 and the silicon substrate 101. In addition, the source/drain regions 106 are connected with a bit line (not shown) in an upper layer through a contact (not shown).

In such a nonvolatile semiconductor memory, a binary data can be stored by selecting a charged state of the nitride film in the ONO film 107, that is, by depending on whether electrons are stored in the nitride film or not. Then, by controlling the charged state of each of the ONO films 107 on both sides of the control gate 104 independently, the data of two bits 102 can be stored in one memory cell. It should be noted that the memory gate 108 is provided in order to simplify injection and drawing out of the electrons into and from the ONO film.

However, the conventional nonvolatile semiconductor memory has following problems. That is, in the conventional nonvolatile semiconductor memory, the control gate 104 and the memory gate 108 are electrically separated. Therefore, it is necessary to independently control the control gate 104 and the memory gate 108. As a result, a control circuit in the nonvolatile semiconductor memory becomes complex and large. Also, a silicide layer is not formed on the memory gate 108, so that the memory gate 108 has high resistance. Therefore, the conventional nonvolatile semiconductor memory is unsuitable for high-speed operation. For this reason, a metal wiring (not shown) is provided in an upper wiring layer, and an contact (not shown) is provided for every tens of the memory cells to connect the memory gate 108 with the metal wiring. Thus, the entire wiring resistance is decreased. As a result, a layout area of the nonvolatile semiconductor memory shall be increased.

To solve such a problem, a nonvolatile semiconductor memory is disclosed in Japanese Laid Open Patent Application (JP-P2001-156188A), in which a memory gate is connected with a control gate. FIG. 2 is a cross sectional view of the conventional nonvolatile semiconductor memory. As shown in FIG. 2, this conventional nonvolatile semiconductor memory is composed of a memory cell formed on the surface of a p-type semiconductor substrate 111. In the memory cell, an $n^-$-type diffusion layer 120 and an $n^+$-type diffusion layer 121 are formed as source/drain regions on the surface of the p-type semiconductor substrate 111. A gate insulating film 112 and a control gate 113 are provided on the region between the source/drain regions. Charge storage layers 114 are provided on the sides of the control gate 113 above the n-type diffusion layer 120. The charge storage layer 114 is an ONO film, in which a first oxide film 115, a nitride film 116, and a second oxide film 117 are laminated in this order. Electrons are stored in the nitride film 116. Also, a memory electrode 118 is provided on the charge storage layer 114. A sidewall insulating film 119 is provided on the each of the memory gates 118. The top end of the memory gate 118 is as high as that of the charge storage layer 114. A silicide 122 is formed on the control gate 113, the charge storage layer 114, and the memory gate 118 in the nonvolatile semiconductor memory.

In the conventional nonvolatile semiconductor memory shown in FIG. 2, the memory gate 118 is connected with the control gate 113 through the silicide film 122. Therefore, the control gate 113 and the memory gate 118 can be driven by a common control circuit. Also, the upper layer wiring and the contact are not necessary to reduce the resistance of the memory gate 18. As a result, the layout area of the nonvolatile semiconductor memory can be decreased.

However, the above-mentioned conventional technique has following problems. In the conventional nonvolatile semiconductor memory shown in FIG. 2, the silicide 122 bridges the memory gates 118 and the control gate 113 on the charge storage layer 114. However, the charge storage layer 114 is an insulating layer. It is not possible to form the silicide layer on the insulating layer by using metals such as cobalt (Co), nickel (Ni), and palladium (Pd) that are diffused in the silicon containing layer on reaction with the metals and silicon (Si). In other word, the silicide film 122 cannot be provided by forming a metal layer made of Co, Ni, Pd, and the like on the charge storage layer 114 by sputtering, and by reacting the metal layer with silicon included in the memory gate 118 and the control gate 113. This is because atoms in the metal layer such as Co, Ni, Pd and the like are undesirably diffused in the control gate 113 or remained on the memory gate 118 with no reaction.

On the other hand, in case of titanium (Ti), Si atoms are diffused on the reaction of titanium with silicon, and is hardly moves itself. Therefore, when a Ti layer is formed on the charge storage layer 114 for the silicide film, the silicide layer may be able to be provided on the charge storage layer 114 through self-increasing since the silicon atoms are diffused from the memory gate 118 and the control gate 113. However, occasionally, the silicide layer might not be able to be provided well, and reliability is low. Moreover, in the nonvolatile semiconductor memory shown in FIG. 2, the memory gate 118 is connected with the control gate 113 by only the silicide film. Therefore, connection reliability is low.

SUMMARY OF THE INVENTION

In an aspect of the present invention, a nonvolatile semiconductor memory device includes diffusion layers formed in a semiconductor substrate, a gate insulating film formed on at least a portion of a channel region between the diffusion layers in the semiconductor substrate, and a control gate formed on the gate insulating film. The nonvolatile semiconductor memory device also includes electric charge storage insulating films formed on side surfaces of the control gate, memory gates formed on side surfaces of the sidewall insulating films to be higher than the sidewall insulating film, and a silicide film formed to connect the memory gates and the control electrode.

Here, the control gate is preferably formed to be lower than the electric charge storage insulating films.

Also, the electric charge storage insulating film may include a film portion formed on the semiconductor substrate between the gate insulating film and one of the diffusion layers.

Also, the electric charge storage insulating film may include a first silicon oxide film, a film formed on the first silicon oxide film, and having a dielectric constant higher than that of the first silicon oxide film, and a second silicon oxide film formed on the film.

Also, the electric charge storage insulating film may include an insulating film with conductive particles dispersed therein.

Also, the silicide film is preferably formed to cover a top portion of each of the memory gates and a surface of the control gate.

Also, the silicide film may contain metal whose atoms diffuse in a silicon containing layer through silicidation reaction. In this case, it is preferable that the metal is at least one selected from the group consisting of Ni, Co and Pd.

Also, the nonvolatile semiconductor memory device may further include a silicon film formed to cover a top portion of each of the memory gates and to be connected with the control gate. In this case, the silicide film is preferably formed to cover a top portion of each of the silicon films and a surface of the control gate.

In another aspect of the present invention, a method of manufacturing a nonvolatile semiconductor memory device, is achieved by a first insulating film on a semiconductor substrate; by forming device isolation sections in the semiconductor substrate; by forming a first structure on the semiconductor substrate, the first structure comprising a gate insulating film obtained from the first insulating film and a control gate; by forming a second insulating film to cover an upper surface and side surfaces of the first structure and a surface of the semiconductor substrate; by forming a first conductive film on the second insulating film; by etching the first conductive film, the second insulating film and the first structure to form a second structure in which the control gate is formed on the semiconductor substrate through the gate insulating film, electric charge storage insulating films are formed from the second insulating film to contact side surfaces of the control gate, memory gates are formed from the first conductive film on side surfaces of the electric charge storage insulating films, a diffusion layer is formed in the semiconductor substrate between two of the second structures; and by forming a silicide film to connect the memory gates and the control gate.

Here, the forming a second insulating film may be achieved by forming the second insulating film such that the electric charge storage insulating film to cover the semiconductor substrate between the gate insulating film and one of the diffusion layers. In this case, the forming a second insulating film may be achieved by forming a first silicon oxide film; by forming a film on the first silicon oxide film, to have a dielectric constant higher than that of the first silicon oxide film; and by forming a second silicon oxide film on the film.

Also, the forming a second insulating film may be achieved by an insulating film with conductive particles dispersed therein.

Also, the etching may be achieved by etching the second insulating film such that the electric charge storage insulating films are higher than the control gate.

Also, the forming a silicide film may be achieved by forming the silicide film to cover a top portion of each of the memory gates and a surface of the control gate.

Also, the forming a silicide film may be achieved by forming the silicide film containing metal whose atoms diffuse in a silicon containing layer through silicidation reaction. In this case, it is preferable that the metal is at least one selected from the group consisting of Ni, Co and Pd.

Also, the method may be achieved by further including forming a silicon film to cover a top portion of each of the memory gates and to be connected with the control gate. In this case, the forming a silicide film may be achieved by forming the silicide film to cover a top portion of each of the silicon films and a surface of the control gate.

BRIEF DESCRIPTION OF THE DRAWINGS

FIGS. 5A-1 to 5D-1 to FIGS. 5A-11 to 5D-11 are cross sectional views of the nonvolatile semiconductor memory in a manufacturing method in a third embodiment of the present invention; and FIGS. 6A-1 to 6D-1 are cross sectional views of the nonvolatile semiconductor memory in the manufacturing method in a fourth embodiment of the present invention.

DESCRIPTION OF THE PREFERRED EMBODIMENTS

Hereinafter, a nonvolatile semiconductor memory device of the present invention will be described in detail with reference to the attached drawings.

Figure 3:
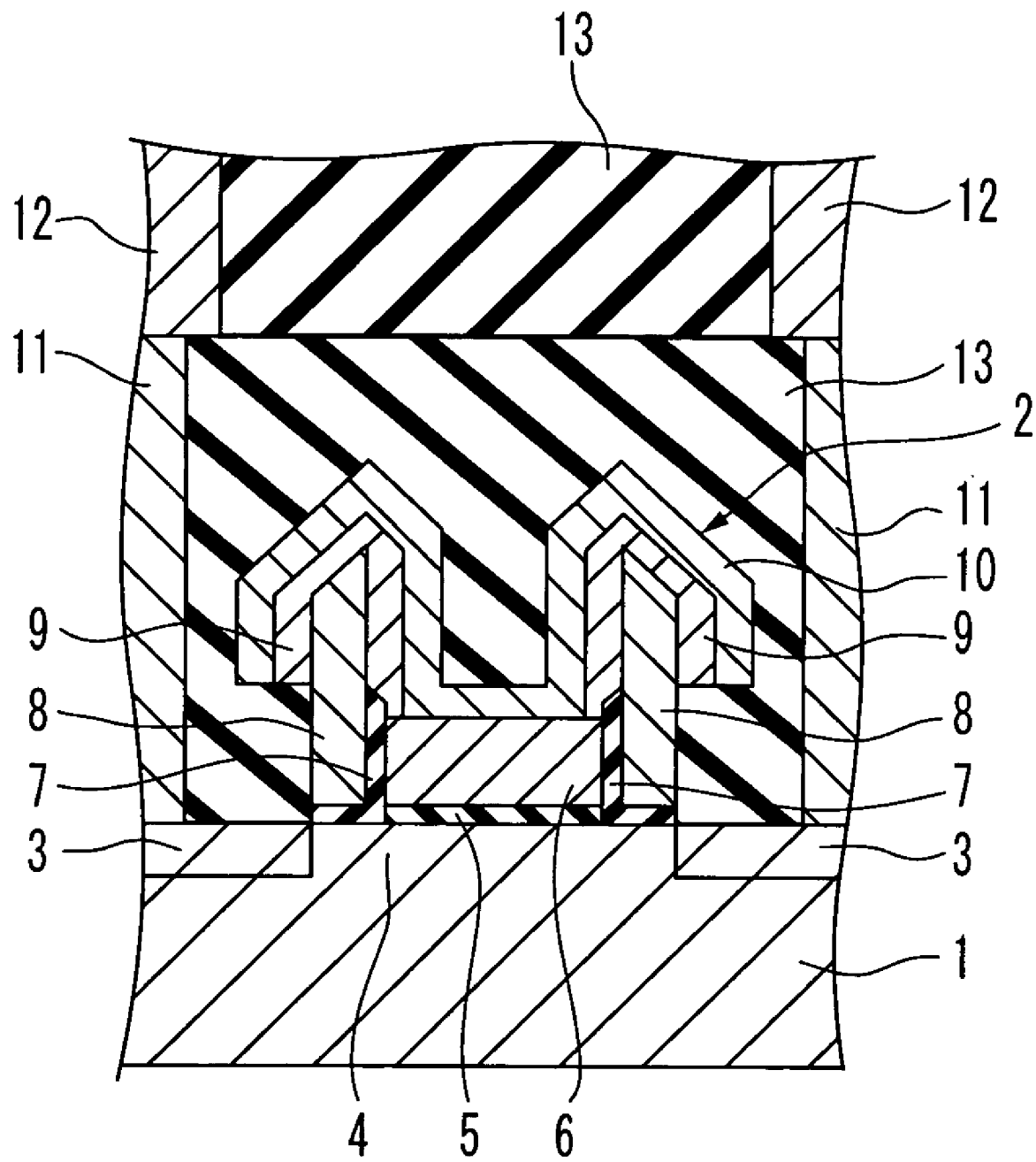
FIG. 3 is a cross sectional view showing a nonvolatile semiconductor memory according to a first embodiment of the present invention.

First, the nonvolatile semiconductor memory device according to the first embodiment of the present invention will be described. FIG. 3 is a cross sectional view showing the nonvolatile semiconductor memory in the first embodiment. As shown in FIG. 3, the nonvolatile semiconductor memory includes, for instance, a p-type silicon substrate 1. A plurality of n-type MOS transistors is formed on the surface of the silicon substrate 1 in a matrix. Each MOS transistor configures a memory cell 2. That is, a plurality of memory cells 2 are arranged in a matrix in the nonvolatile semiconductor memory in the first embodiment.

A device isolation region (not shown) and a P-well (P-type well: not shown) are formed in the memory cell 2 in the surface of the silicon substrate 1. N-type diffusion layers 3 are formed in the surface of the P-well as source/drain regions. A gate insulating film 5 is provided in a region between the diffusion layers 3 on the silicon substrate 1, that is, provided for a central portion of the region on a channel region 4 thereof. Also, a control gate 6 functioning as a word line is provided on the gate insulating film 5. Further, ONO films 7 as charge storage films are provided on the sides of the gate insulating film 5 and the control gate 6, and is provided on a portion of the channel region 4 where the gate insulating film 5 is not formed. That is, the ONO films 7 are provided on both sides of the control gate 6. The ONO film 7 has a laminate structure in which a silicon oxide film, a silicon nitride film, and a silicon oxide film are laminated in this order. It should be noted that a dielectric constant of the silicon nitride film is higher than that of the silicon oxide film.

In addition, a memory gate 8 is provided to put a vertical portion of the ONO film 7 between the control gate 6 and the memory gate 8. That is, the memory gates 8 are provided on the both sides of the control gate 6. Thus, the ONO film 7 is provided between the memory gate 8 and the silicon substrate 1, and between the memory gate 8 and the control gate 6. Here, the vertical portion of the ONO film 7 between the control gate 6 and the memory gate 8, that is, the portion formed on the side of the control gate 6 is a side insulating film. A top end of the memory gate 8 is higher than that of the ONO film 7.

Also, a polysilicon layer 9 is provided to cover an upper portion of the memory gate 8 and to contact the top end and side surface of the ONO film 7 and a part of top surface of the control gate 6. That is, the polysilicon layers 9 are arranged on the control gate 6, the ONO films 7, and the memory gates 8. A silicide layer 10 is formed on the polysilicon layer 9 and the control gate 6. That is to say, the polysilicon layer 9 is provided between the memory gate 8 and the silicide layer 10. The memory gate 8 is connected with the control gate 6 through the polysilicon layer 9 and the silicide layer 10. The silicide layer 10 is composed of silicide formed through a silicide reaction of silicon and a metal as a diffusion feed. For instance, the silicide contains at least one of Co, Ni, and Pd and is formed as nickel silicide, cobalt silicide or palladium silicide. The silicide layer 10 has a portion formed on the upper surface of the control gate 6, i.e., a portion formed in parallel to the surface of the silicon substrate 1, and a portion formed on the side surface of the polysilicon layer 9, i.e., a portion perpendicular to the surface of the silicon substrate 1.

Moreover, a contact 11 is provided on the diffusion layer 3 and a first wiring 12 is provided on the contacts 11. The source/drain layers 3 are connected with the first wirings 12 through the contacts 11. Here, an interlayer insulating film 13 fills in a region on the silicon substrate 1 other than the memory cell 2, the contacts 11, and the first wirings 12.

Next, an operation of the nonvolatile semiconductor memory in the first embodiment with the above structure will be described. In the nonvolatile semiconductor memory, a binary data is stored in the memory cell based on whether or not the nitride film of the ONO film 7 stores electrons. At this time, by respectively and independently injecting and drawing out the electrons into and from the ONO films, which are arranged under one side of the memory gate 8 and the other side of the memory gate 8, the data of two bits are stored in the memory cell 2 of one N-type MOS transistor.

In the write operation of the data in the selected side of the memory cell, the positive potential of approximately 5V is applied to the control gate 6 and the memory gate 8. Also, the positive voltage of approximately 5V is applied to the diffusion layer 3 on the selected side of the ONO films 7 into which the data is written. At this time, the ground potential is applied to the diffusion layer 3 on the non-selected side of the ONO films 7 into which the data is not written. As a result, the electrons as careers are accelerated to CHEs (Channel Hot Electrons) on the selected side in the channel region 4, and are injected into the nitride film of the ONO film 7 on the selected side. Thus, the nitride film holds negative charge and the data is written.

Also, in the erasing operation of the written data, the negative voltage of approximately −5V is applied to the control gate 6 and the memory gate 8, the positive voltage of approximately 5V is applied to the diffusion layer 3 on the selected side, and the ground potential is applied to the diffusion layer 3 on the non-selected side. Thus, a part of holes generated through interband tunneling gets energy and change to hot holes while moving during the electric field of a depletion region in the direction of the channel. A part of the hot holes is injected into the ONO film 7 on the selected side, combines with the electrons in the nitride film of the ONO film 7. Thus, the electrons are extinguished. As a result, the data is erased.

In addition, in a read operation of the data, the positive voltage of approximately 3V is applied to the control gate 6 and the memory gate 8, and the positive voltage of approximately 1.5V is applied to the diffusion layer 3 on the non-selected side. In this state, a threshold of the memory cell 2 is detected. In this case, even if negative charge has been charged in the ONO film 7 on the non-selected side, the depletion layer from the diffusion layer 3 extends to the region just under the ONO film 7 on the non-selected side in the silicon substrate 1. Therefore, influence of the negative charge in the ONO film 7 on the non-selected side is restricted and the charge state of the ONO film 7 on the selected side can be still detected. That is to say, the threshold is more increased if negative charge is stored in the ONO film 7 on the selected side, compared with a case where negative charge is not stored. As a result, the data written in the ONO film 7 on the selected side can be read.

In the first embodiment, the control gate 6 and the memory gate 8 can be commonly driven by a control circuit since the memory gates 8 are connected with the control gate 6 through the polysilicon layers 9 and the silicide layer 10. That is to say, it is possible to simplify the control circuit. Also, the upper layer wiring and the contacts to decrease the wiring resistance of the memory gate 8 are unnecessary. Therefore, the layout area of the nonvolatile semiconductor memory can be decreased.

Also, the connection reliability between the memory gate 8 and the control gate 10 is high since the memory gate 8 is connected with the control gate 6 through the polysilicon layers 9 and the silicide layer 10

In addition, the silicide layer 10 is formed on the surface of the polysilicon layer 9 and the silicide layer 10 can be formed of a nickel silicide, a cobalt silicide or a palladium silicide. As a result, the memory cell 2 can be miniaturized in size to miniaturize the nonvolatile semiconductor memory, compared with a case where titanium silicide is formed. Therefore, the nonvolatile semiconductor memory can be consolidated with the integrated circuit for logic using minute transistors.

Figure 4:
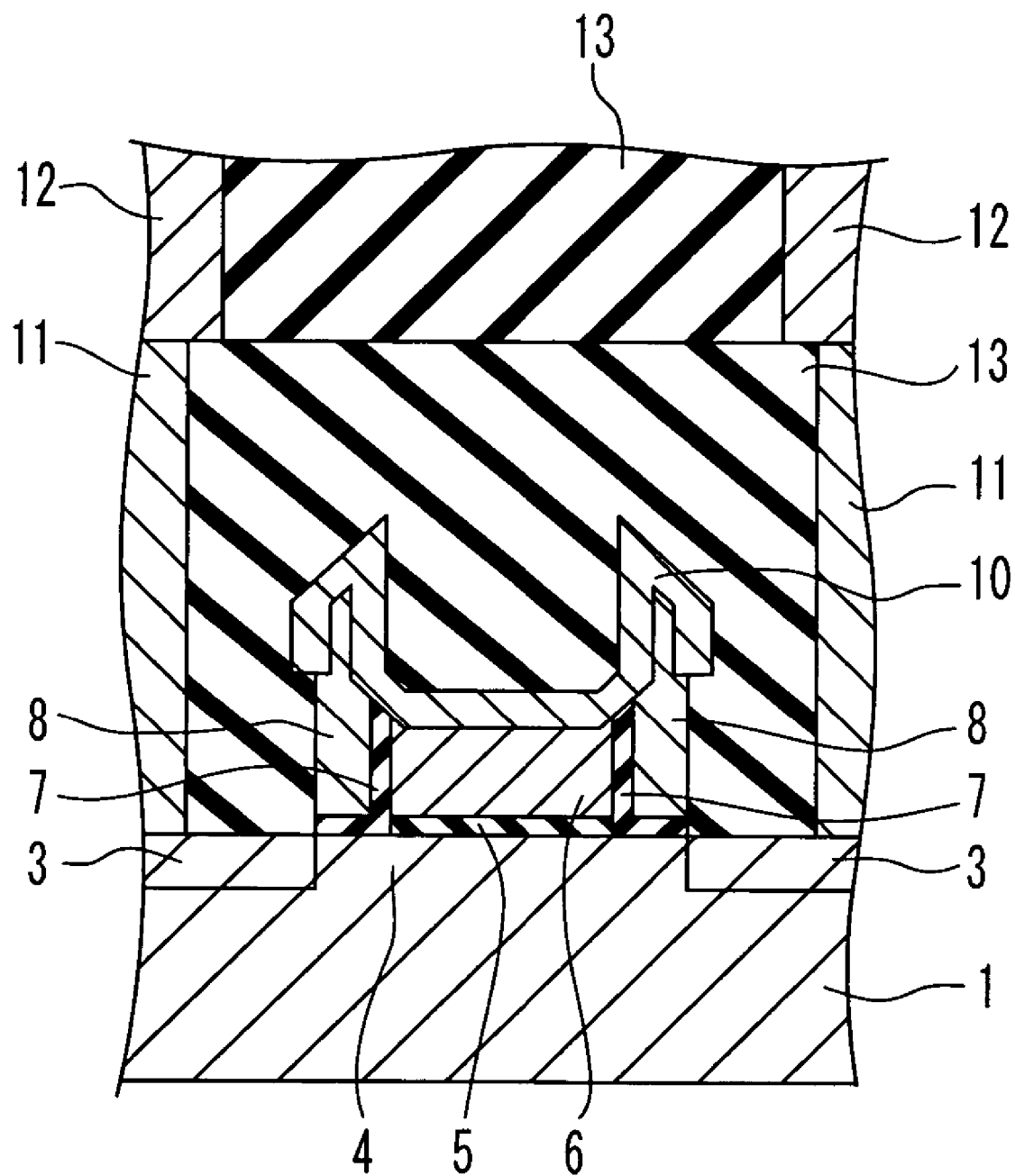
FIG. 4 is a cross sectional view showing the nonvolatile semiconductor memory according to a second embodiment of the present invention.

Next, the nonvolatile semiconductor memory according to the second embodiment of the present invention will be described. FIG. 4 is a cross sectional view showing the nonvolatile semiconductor memory in the second embodiment. As shown in FIG. 4, the nonvolatile semiconductor memory in the second embodiment is different from the first embodiment in that the silicide layer 10 is formed on the surface of the polysilicon layer 9 (see FIG. 1) thicker than in the above-mentioned first embodiment, and the polysilicon layer 9 is disappeared. The structure and operation of the nonvolatile semiconductor memory other than the above are same as those of the first embodiment.

The polysilicon layer 9 has been disappeared in the second embodiment since the silicide layer 10 is formed thickly. Due to the thickness of the silicide layer 10, neither an electrical conductivity nor connection reliability should be decreased between the control gate 6 and the memory gate 8, compared with the first embodiment. Therefore, the effect of the second embodiment is same as in the above-mentioned first embodiment.

In the above-mentioned first and second embodiments, a film in which conductive particles (quantum dots) are embedded in the insulating film may be used as the charge storage layer in place to the ONO film 7. Also, a film of three layers, in which a silicon oxide film, a high dielectric constant film and a silicon oxide film are laminated in this order, may be also used as the charge storage layer in place to the ONO film 7. The high dielectric constant film is such as a hafnium oxide ($HfO_2$) film and aluminum oxide ($Al_2O_3$) film. Moreover, the present invention includes an intermediate state of the first and second embodiments. That is, the polysilicon layer 9 may remain only on the sides of the memory gate 8.

Next, the nonvolatile semiconductor memory according to the third embodiment of the present invention will be described. In the third embodiment, a manufacturing method of the nonvolatile semiconductor memory in the first embodiment will be described. FIGS. 5A-1 to 5D-1 to FIGS. 5A-11 to 5D-11 are cross sectional views of the nonvolatile semiconductor memory in the manufacturing method in the third embodiment. FIGS. 5A-1 to 5A-11 show cross sectional views of the nonvolatile semiconductor memory in the width direction of the control gate, i.e., in a direction orthogonal to the word line. FIGS. 5B-1 to 5B-11 show cross-sectional views of the nonvolatile semiconductor memory along the line A-A' in FIGS. 5A-1 to 5A-11, and FIGS. 5C-1 to 5C-11 show cross-sectional views of the nonvolatile semiconductor memory along the line B-B' in FIGS. 5A-1 to 5A-11. Also, FIGS. 5C-1 to 5C-11 show cross-sectional views of the nonvolatile semiconductor memory along the line A-A' in FIGS. 5A-1 to 5A-11, and FIGS. 5D-1 to 5D-11 show cross-sectional views of the nonvolatile semiconductor memory along the line B-B' in FIGS. 5A-1 to 5A-11.

Figure 1:
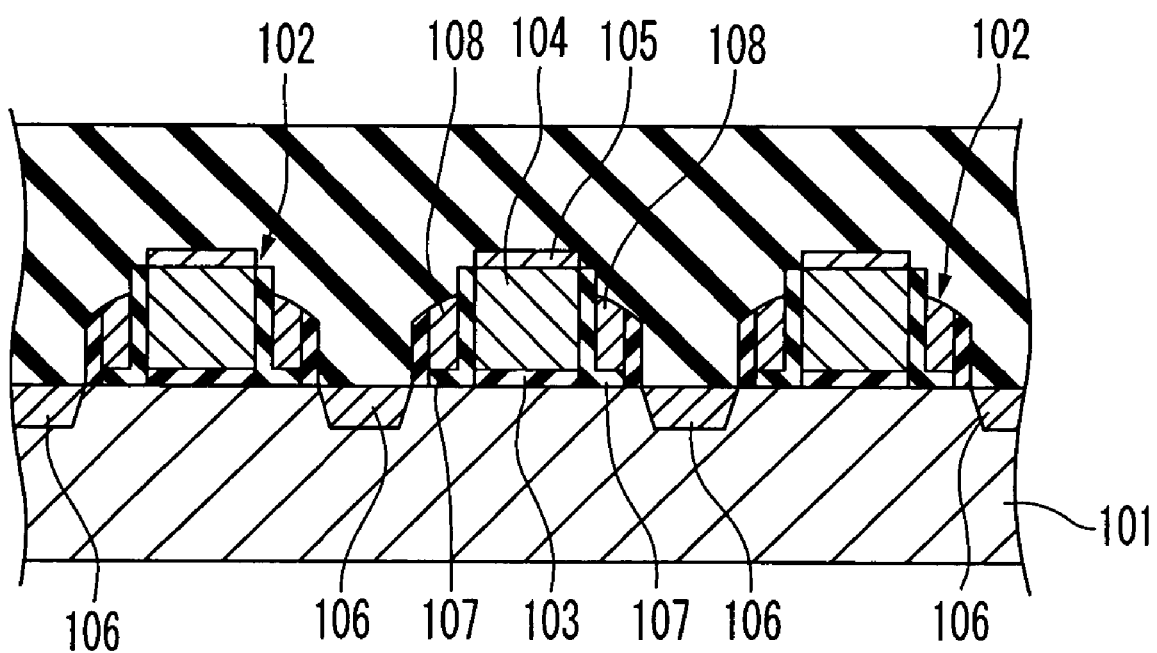
FIG. 1 is a cross sectional view of a conventional nonvolatile semiconductor memory.
Figures 5, 5A, 5B, 5C, 5D:
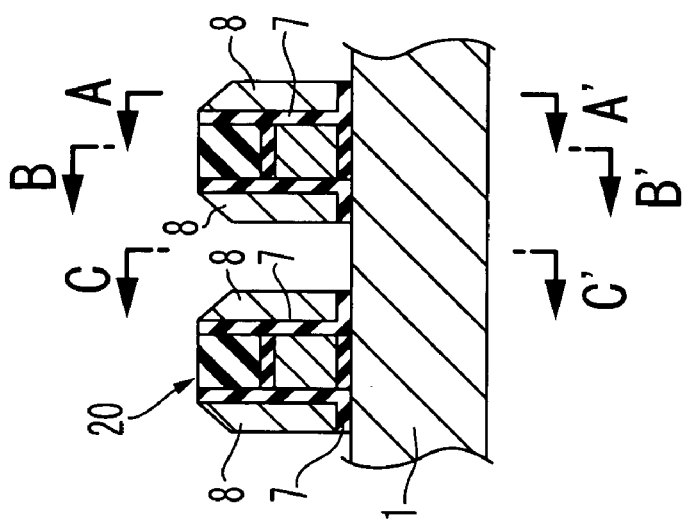

First, as shown in FIGS. 5A-1 to 5D-1, device isolation regions 15 are formed in the surface of the silicon substrate 1 of the p-type by a conventional method. P-wells (not shown) are formed to the regions segmented by the device isolation regions 15 in the surface of the of the silicon substrate 1.

Figure 2:
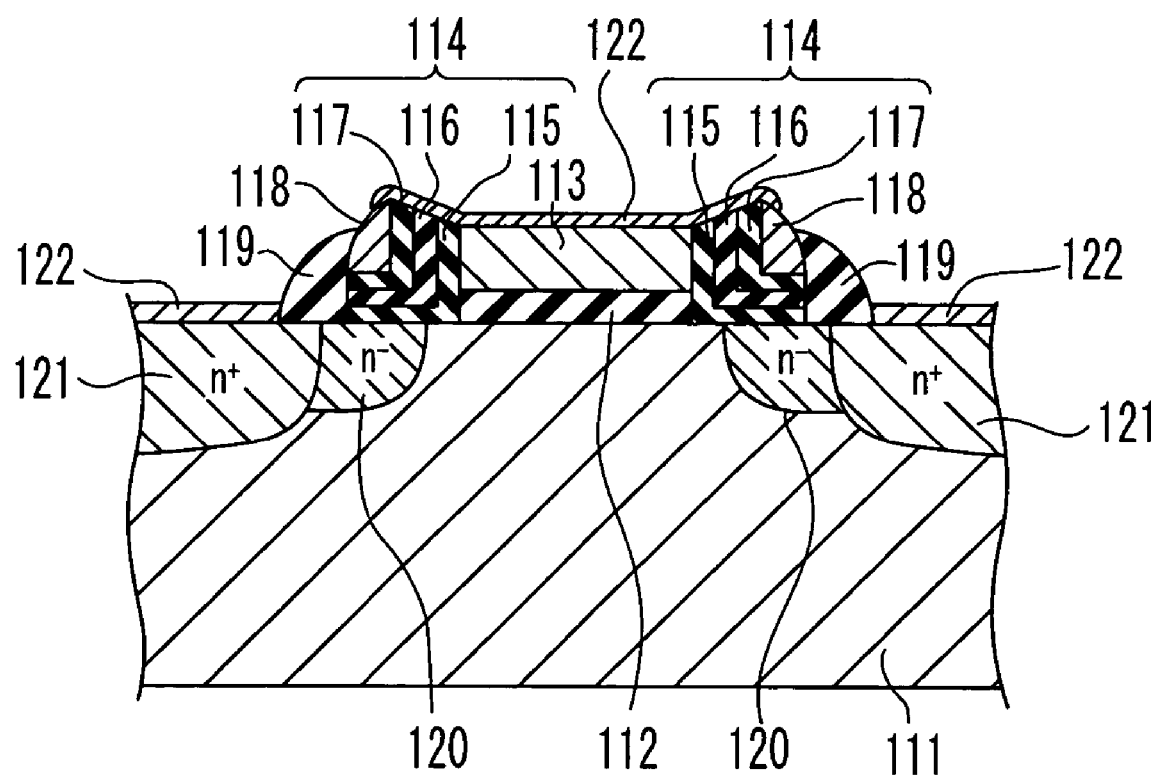
FIG. 2 is a cross sectional view of another conventional nonvolatile semiconductor memory.

Next, as shown in FIGS. 5A-2 to 5D-2, a silicon oxide layer 16 is formed to cover the whole surface of the silicon substrate 1 and then, a polysilicon layer 17 is grown on the silicon oxide layer 16. Subsequently, a silicon oxide layer 18 is formed on the polysilicon layer 17, and a silicon nitride layer 19 is formed on the silicon oxide layer 18.

Next, as shown in FIGS. 5A-3 to 5D-3, the four layers of the silicon nitride layer 19, the silicon oxide layer 18, the polysilicon layer 17 and the silicon oxide layer 16 are all selectively etched and removed. Thus, a patterning is carried out. At this time, a portion of the four layers is remained where a control gate is to be formed, and the other portion of the four layers is removed. As a result, a layered structure 20 is formed, which is made from the silicon oxide layer 16, the polysilicon layer 17, the silicon oxide layer 18, and the silicon nitride layer 19. In this case, the patterned silicon oxide layer 16 is a gate oxide film 5, and the patterned polysilicon layer 17 is the control gate 6.

Next, as shown in FIGS. 5A-4 to 5D-4, a silicon oxide layer, a silicon nitride layer, and a silicon oxide layer are formed on the entire surface in this order to form an ONO film 7 as a charge storage layer. Then, the polysilicon layer 21 is formed on the ONO film 7.

Next, as shown in FIGS. 5A-5 to 5D-5, an etch-back is carried out to remove the ONO film 7 and the polysilicon layer 21 formed on the silicon nitride film 19 until a part of the silicon substrate 1 is exposed. Thus, the ONO film 7 and the polysilicon layer 21 are remained on only the sides of the layered structure 20. At this time, the remained polysilicon layer 21 is the memory gate 8. The ONO film 7 remains between the memory gate 8 and the layered structure 20, and between the memory gate 8 and the silicon substrate 1. It should be noted that an unnecessary polysilicon layer 21 may be removed by etching using a mask before the etch-back.

Next, as shown in FIGS. 5A-6 to 5D-6, an n-type impurity such as arsenic (As) is ion-implanted by using the layered structure 20, the ONO film 7, and the memory gate 8 as a mask. Thus, the diffusion layers 3 of the n-type are formed in a region of the silicon substrate 1 other than a region under the layered structure 20, the ONO film 7, and the memory gate 8, and the device isolation regions. The diffusion layer 3 is the source/drain region of the MOS transistor. The region between the diffusion layers 3 in the surface on the silicon substrate 1 is the channel region 4. Subsequently, the silicon oxide layer 22 is formed on the silicon substrate 1 to cover the layered structure 20, the ONO film 7, and the memory gate 8.

Next, as shown in FIGS. 5A-7 to 5D-7, the silicon oxide layer 22 is etched back. At this time, upper portions of the silicon nitride film 19 and the ONO film 7 are removed. As a result, the top ends of the silicon nitride film 19 and the ONO film 7 become lower than the top ends of the memory gate 8. When the width of the diffusion layer 3 is wide, the upper portion of the silicon oxide 22 may be removed by a CMP (Chemical Mechanical Polishing) method before the etch-back.

Next, as shown in FIGS. 5A-8 to 5D-8, the silicon nitride film 19 is removed by a wet etching. Then, the silicon oxide film 18 is removed by the wet etching.

Next, as shown in FIGS. 5A-9 to 5D-9, the polysilicon layer 23 is grown on the whole surface of the control gate 6, the ONO film 7, the memory gate 8, and the silicon oxide film 22. At this time, an amorphous silicon layer may be deposited in place to the polysilicon layer 23.

Next, as shown in FIGS. 5A-10 to 5D-10, the polysilicon layer 23 is etched back. Thus, the polysilicon layer 23 is remained on only the a region contacting the memory gate 8, and both sides on the control gate 6, that is, a region adjacent to the ONO film 7, and the polysilicon layer 23 is removed from the other region. As a result, the polysilicon film 9 connecting the memory gate 8, the ONO film 7, and the control gate 6 to each other is formed from the remained polysilicon layer 23.

Next, as shown in FIGS. 5A-11 to 5D-11, a Co layer (not shown) is formed on the whole surface by a sputtering method, and then heat-treat is carried out so that the Co layer and the polysilicon layer 9 react with each other. As a result, Co atoms of the Co layer are diffused into the polysilicon layer 9 and the control gate 6, and a cobalt silicide layer 10 is formed on the surfaces of the polysilicon layer 9 and the control gate 6. In this case, in place of forming the cobalt silicide layer, a nickel silicide layer may be formed by sputtering Ni. Otherwise, by sputtering Pd, a palladium silicide layer may be formed. Furthermore, by sputtering metal other than Co, Ni, or Pd, a silicide layer may be formed. In this way, the memory cell 2 is formed.

Finally, as shown in FIG. 3, the interlayer insulating film 13 is formed to embed the MOS transistor by the conventional method. Subsequently, the contacts 11 connected with the diffusion layers 3 are formed to in the interlayer insulating film 13. Then, the first wirings 12 are formed and connected with the contacts 11. In this way, the nonvolatile semiconductor memory is manufactured.

In the manufacturing method in the third embodiment of the present invention, as shown in FIGS. 5A-9 to 5D-9 and FIGS. 5A-10 to 5D-10, the polysilicon film 9 is formed to connect the memory gate 8, the ONO film 7, and the control gate 6. The silicide layer 10 is formed on the surface of this polysilicon film 9. Therefore, the silicide layer 10 can be formed of nickel silicide, cobalt silicide or palladium silicide. As a result, compared with a case of forming a titanium silicide, the memory cell 2 can be miniaturized, and a miniaturized nonvolatile semiconductor memory can be manufactured. Such a miniaturized nonvolatile semiconductor memory can be consolidated with the logic integrated circuit including minute transistors.

Also, in the nonvolatile semiconductor memory manufactured by the manufacturing method in the third embodiment, the memory gate 8 is connected the control gate 6 through the polysilicon layer 9 and the silicide layer 10. Therefore, the control gate 6 and the memory gate 8 can be driven by a common control circuit (not shown). In addition, it is unnecessary to form an upper layer wiring for decreasing a wiring resistance of the memory gate 8. As a result, the nonvolatile semiconductor memory with small layout area can be manufactured.

Moreover, the above-mentioned nonvolatile semiconductor memory has high connection reliability between the memory gate 8 and the control gate 10 since the memory gate 8 is connected with the control gate 6 through the polysilicon layer 9 and the silicide layer 10.

Next, the manufacturing method according to the forth embodiment of the present invention will be described. In the third embodiment, the manufacturing method of the nonvolatile semiconductor memory in the second embodiment is described. FIGS. 6A-1 to 6D-1 are cross sectional views of the nonvolatile semiconductor memory in the manufacturing method in the forth embodiment. FIG. 6A-1 shows a cross sectional view of the nonvolatile semiconductor memory in the width direction of the control gate, that is, in a direction orthogonal to the word line. FIG. 6B-1 shows a cross sectional view of the nonvolatile semiconductor memory along the line A-A' in FIG. 6A-1. FIG. 6C-1 shows a cross sectional view of the nonvolatile semiconductor memory along the line B-B' in FIG. 6A-1, and FIG. 6D-1 shows a cross sectional view of the nonvolatile semiconductor memory along the line C-C' in FIG. 6A-1.

First, by the same processes as shown in FIGS. 5A-1 to 5D-1 to FIGS. 5A-10 to 5D-10 in the third embodiment, the diffusion layers 3 of the n-type are formed in the surface of the silicon substrate 1 of the p-type, and the gate insulating film 5 and the control gate 6 are formed on the region between the diffusion layers. Also, the ONO film 7 and the memory gate 8 are formed on both sides of the gate insulating film 5 and the control gate 6. Then, the polysilicon layer 9 is formed to cover the upper portion of the memory gate 8 and to contact the both sides of the control gate 6.

Next, as shown in FIGS. 6A-1 to 6D-1, the Co layer (not shown) is formed by the sputtering method. Subsequently, a heat treatment is carried out to react the Co layer and the polysilicon layer 9. Thus, the silicide layer 10 of a cobalt silicide is formed. At this time, the polysilicon layer 9 is entirely silicided to form the silicide layer 10, and the polysilicon layer 9 disappears. In this case, a part of the memory gate 8 may be silicided. Manufacturing methods and the effects other than the above-mentioned in the fourth embodiment are same as that of the third embodiment.

In the third and fourth embodiments, a film in which the conductive particles (quantum dots) embedded in the insulating film may be formed as the charge storage layer in place to the ONO film 7 in the process shown in FIGS. 5A-4 to 5D-4. Also, in place to the ONO film 7, three layers of a silicon oxide layer, a high dielectric layer and a silicon oxide layer may be laminated in this order as the charge storage layer. The high dielectric layer may be formed of hafnium oxide ($HfO_2$) or aluminum oxide ($Al_2O_3$). In addition, it is not necessary to remain the polysilicon layer 9 on the surface of the memory gate 8 in the process shown in FIGS. 5A-10 to 5D-10. Further, the polysilicon layer 9 may be remained only on the side of the memory gate 8 after the polysilicon layer 9 is silicided in the process shown in FIGS. 5A-11 to 5D-11 and FIGS. 6A-1 and 6D-1.

In this way, in the third and fourth embodiments of the present invention, (1) a method of manufacturing a nonvolatile semiconductor memory device, includes: a first insulating film on a semiconductor substrate; forming device isolation sections in the semiconductor substrate; forming a first structure on the semiconductor substrate, the first structure comprising a gate insulating film obtained from the first insulating film and a control gate; forming a second insulating film to cover an upper surface and side surfaces of the first structure and a surface of the semiconductor substrate; forming a first conductive film on the second insulating film; etching the first conductive film, the second insulating film and the first structure to form a second structure in which the control gate is formed on the semiconductor substrate through the gate insulating film, electric charge storage insulating films are formed from the second insulating film to contact side surfaces of the control gate, memory gates are formed from the first conductive film on side surfaces of the electric charge storage insulating films, a diffusion layer is formed in the semiconductor substrate between two of the second structures; and forming a silicide film to connect the memory gates and the control gate.

Also, in case of (1), (2) the forming a second insulating film include: forming the second insulating film such that the electric charge storage insulating film to cover the semiconductor substrate between the gate insulating film and one of the diffusion layers.

Also, in case of (2), the forming a second insulating film includes: forming a first silicon oxide film; forming a film on the first silicon oxide film, to have a dielectric constant higher than that of the first silicon oxide film; and forming a second silicon oxide film on the film.

Also, in case of (2), the forming a second insulating film includes: an insulating film with conductive particles dispersed therein.

Also, in case of (1), the etching include: etching the second insulating film such that the electric charge storage insulating films are higher than the control gate.

Also, in case of (1), the forming a silicide film includes: forming the silicide film to cover a top portion of each of the memory gates and a surface of the control gate.

Also, in case of (1), the forming a silicide film includes: forming the silicide film containing metal whose atoms diffuse in a silicon containing layer through silicidation reaction. In this case, the metal is at least one selected from the group consisting of Ni, Co and Pd.

Also, in case of (1), the method further includes: forming a silicon film to cover a top portion of each of the memory gates and to be connected with the control gate. In this case, the forming a silicide film includes: forming the silicide film to cover a top portion of each of the silicon films and a surface of the control gate.

In the present invention, connection reliability can be improved because a third conductive layer including silicon is provided on first and second conductive layers and a fourth insulating film, and the third conductive layer is changed into a silicide layer. Moreover, a control circuit can be simplified because a memory gate electrode is connected with a control gate electrode.

What is claimed is:

1. A nonvolatile semiconductor memory device comprising:
    diffusion layers formed in a semiconductor substrate;
    a gate insulating film formed on at least a portion of a channel region between said diffusion layers in said semiconductor substrate;
    a control gate formed on said gate insulating film;
    electric charge storage insulating films formed on side surfaces of said control gate;
    memory gates formed on side surfaces of said electric charge storage insulating films to be higher than said electric charge storage insulating film;
    a silcide film formed to connect said memory gates and said control gate; and
    a silicon film being formed to cover atop portion of each of said memory gates and to be connected with said control gate.

2. The nonvolatile semiconductor memory device according to claim 1, wherein said silicide film is formed to cover a top portion of each of said silicon films and a surface of said control gate.

3. The nonvolatile semiconductor memory device according to claim 1, wherein said silicide film covers a top end and side surface of said electric charge storage insulating film.

4. The nonvolatile semiconductor memory device according to claim 1, wherein said memory gate is connected with the control gate through the silicon film and the silicide film.

5. The nonvolatile semiconductor memory device according to claim 1, said silicide film comprises:
    a portion formed in parallel to said surface of said semiconductor substrate; and
    a portion formed on a side surface of said silicon film, perpendicular to said surface of the semiconductor substrate.

6. The nonvolatile semiconductor memory device according to claim 1, wherein said silicon film contacts said silicide film and said memory gate in a vertically disposed orientation.

7. A nonvolatile semiconductor memory device comprising:
    diffusion layers formed in a semiconductor substrate;
    a gate insulating film fanned on at least a portion of a channel region between said diffusion layers in said semiconductor substrate;
    a control gate formed on said gate insulating film;
    electric charge storage insulating films formed on side surfaces of said control gate;
    memory gates formed on side surfaces of said electric charge storage insulating films;
    a silicide film formed to connect said memory gates and said control gate; and
    a silicon film formed on a top surface of said electric charge storage insulating films,
    wherein a portion of said silicon film is silicided.

8. The nonvolatile semiconductor memory device according to claim 7, wherein said silicon film being formed to cover a top portion of each of said memory gates and to be connected with said control gate.

9. The nonvolatile semiconductor memory device according to claim 8, wherein said silicide film is formed to cover a top portion of each of said silicon films and a surface of said control gate.

* * * * *